(12) United States Patent
Kim et al.

(10) Patent No.: US 7,551,445 B2
(45) Date of Patent: Jun. 23, 2009

(54) PLASMA DISPLAY DEVICE

(75) Inventors: Jung-Heon Kim, Suwon-si (KR); Sang-Young Lee, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 33 days.

(21) Appl. No.: 11/806,837

(22) Filed: Jun. 4, 2007

(65) Prior Publication Data

US 2008/0123270 A1 May 29, 2008

(30) Foreign Application Priority Data

Nov. 27, 2006 (KR) .................. 10-2006-0117754

(51) Int. Cl.
H05K 7/20 (2006.01)
G09G 3/28 (2006.01)
(52) U.S. Cl. .................. 361/704; 361/719; 345/60
(58) Field of Classification Search .................. None
See application file for complete search history.

(56) References Cited

U.S. PATENT DOCUMENTS 7,388,748 B2 *  6/2008  Shin ........................ 361/704

2005/0088092 A1 *  4/2005  Kim et al. .................. 313/582
2005/0259401 A1 * 11/2005  Han et al. .................. 361/704
2006/0283572 A1 * 12/2006  Ha .......................... 165/80.3
2007/0085763 A1 *  4/2007  Jeong ........................ 345/60
2007/0211205 A1 *  9/2007  Shibata ..................... 349/161

FOREIGN PATENT DOCUMENTS

| JP | 61-265848 | 11/1986 |
| KR | 20-1994-0025770 | 11/1994 |
| KR | 10-2001-0036930 | 5/2001 |
| KR | 10-2005-0114450 | 12/2005 |
| KR | 10-2006-0106108 | 10/2006 |
| KR | 10-2006-0117849 | 11/2006 |
| KR | 10-0646567 | 11/2006 |

* cited by examiner

*Primary Examiner*—Boris L Chervinsky
(74) *Attorney, Agent, or Firm*—Robet E. Bushnell, Esq.

(57) ABSTRACT

A plasma display device is constructed with a plasma display panel for visually displaying an image by using a gas discharge, a chassis base coupled to the plasma display panel to support the plasma display panel, a driving board including a board and a circuit device and applying a driving signal to the plasma display panel, a heat dissipation plate having heat dissipation fins and installed on the circuit device to dissipate heat generated from the circuit device, and a weight member installed on at least one of the heat dissipation fins to increase the weight of the heat dissipation fins on which the weight member is installed.

11 Claims, 6 Drawing Sheets

PLASMA DISPLAY DEVICE

CLAIM OF PRIORITY

This application makes reference to, incorporates the same herein, and claims all benefits accruing under 35 U.S.C.§119 from an application for PLASMA DISPLAY DEVICE earlier filed in the Korean Intellectual Property Office on 27 Nov. 2006 and there duly assigned Serial No. 10-2006-0117754.

BACKGROUND OF THE INVENTION

1. Field of the Invention

The present invention relates to a plasma display with reduced driving noise.

2. Description of Related Art

A plasma display device is a display device that can visually display an image using plasma created by gas discharge.

A plasma display device is typically constructed with a plasma display panel (PDP), a chassis base for supporting the PDP, and a plurality of driving boards mounted on an opposite surface of the chassis base to the PDP. The driving boards are connected to electrodes disposed in the PDP through a flexible printed circuit (FPC).

The PDP is constructed with two glass substrates facing each other and sealed together to define a discharge space therein. Therefore, the PDP has a mechanical property that is weak against an external impact. In order to supplement the mechanical strength of the PDP, the chassis base coupled to the PDP is made from a material having high mechanical strength, such as cast iron.

Further, the driving boards are mounted in the rear of the chassis base. The driving boards are constructed by installing circuit devices for performing the logical processes. The driving boards apply a driving signal of a high voltage to the electrodes to generate the discharge of the PDP.

Meanwhile, the circuit devices generate heat during the operation of the circuit devices as the electrical energy is partly converted into thermal energy. The generated heat deteriorates the reliability of the circuit devices. Therefore, a heat sink is installed on each circuit device to dissipate the heat generated by the circuit device.

The heat sink is constructed with a plurality of heat discharge fins to enlarge an overall surface area of the heat sink, and the heat discharge fins generate noise while being vibrated during the operation of the circuit device.

SUMMARY OF THE INVENTION

It is therefore an object of the present invention to provide an improved plasma display device.

It is another object to provide a plasma display device in which noise generated during the operation of a circuit device is reduced.

In an exemplary embodiment of the present invention, a plasma display device is constructed with a plasma display panel for visually displaying an image using a gas discharge, a chassis base coupled to the plasma display panel to support the plasma display panel, a driving board including a board and a circuit device and applying a driving signal to the plasma display panel, a heat dissipation plate having heat dissipation fins and installed on the circuit device to dissipate heat generated from the circuit device; and a weight member installed on the heat dissipation fins to increase a weight of the heat dissipation fins on which the weight member is installed.

The weight member may be coupled to the heat dissipation fins by a bonding member. The weight member may be formed on each of outermost heat dissipation fins among the heat dissipation fins.

The heat dissipation plate is constructed with a main body, which is attached to the circuit device and from which the heat dissipation fins extend. The adjacent dissipation fins face each other.

In another exemplary embodiment of the present invention, a plasma display device is constructed with a plasma display panel for visually displaying an image using a gas discharge, a chassis base coupled to the plasma display panel to support the plasma display panel, a driving board including a board and a circuit device and applying a driving signal to the plasma display panel, and a heat dissipation plate having heat dissipation fins and installed on the circuit device to dissipate heat generated from the circuit device. Some of the heat dissipation fins are different in shape or weight from the rest of the heat dissipation fins.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather these embodiments are provided so that this disclosure will be thorough and complete, and will fully convey the concept of the invention to those skilled in the art. Wherever possible, the same reference numbers will be used throughout the drawings to refer to the same or like parts.

Figure 1:
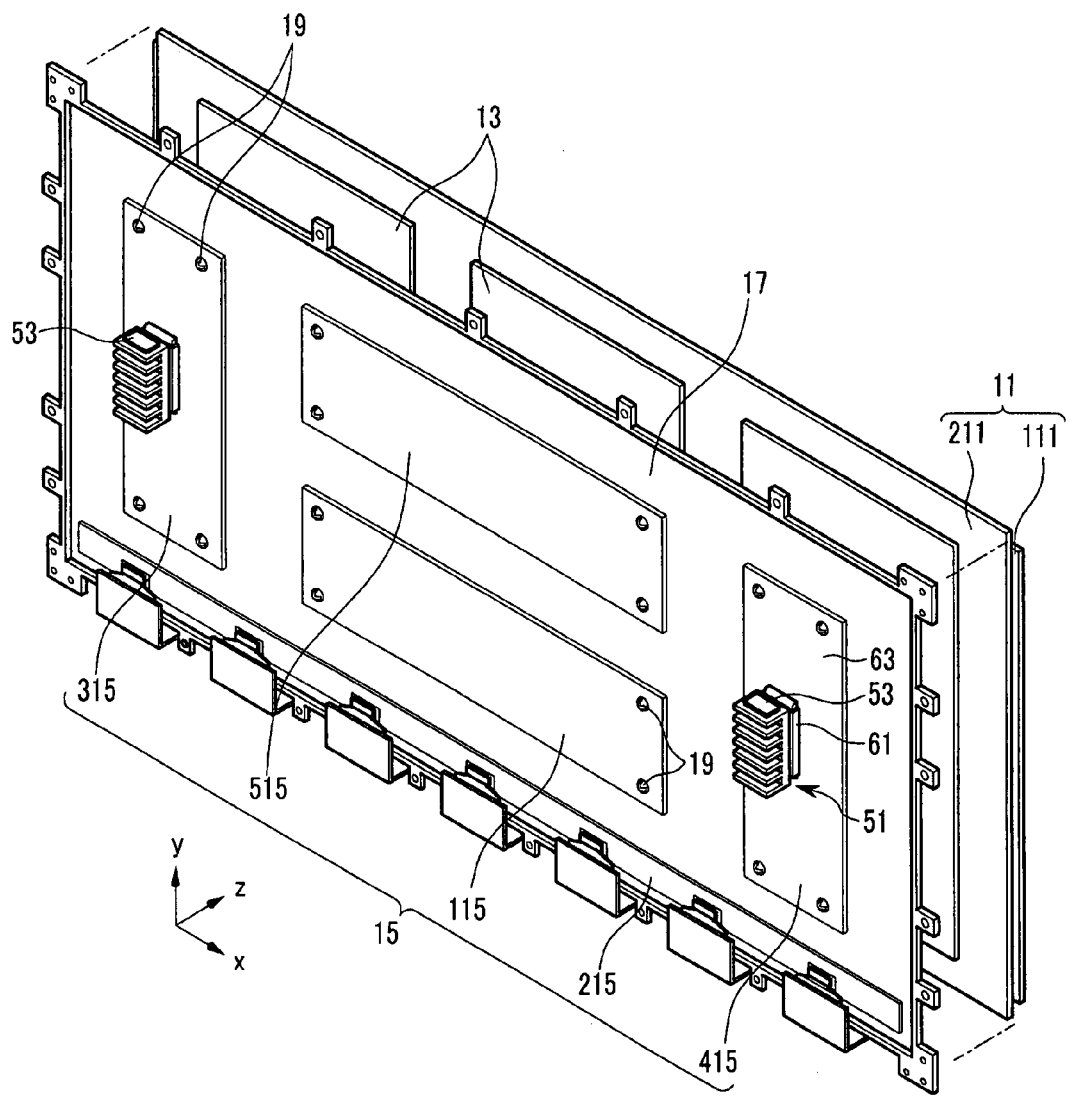
FIG. 1 is a schematic exploded perspective view of a plasma display panel according to a first embodiment of the principles of the present invention.

FIG. 1 is a schematic exploded perspective view of a plasma display device according to an embodiment of principles of the present invention.

Referring to FIG. 1, a plasma display device of an embodiment is constructed with a plasma display panel 11 (hereinafter "panel") displaying a visual image using a gas discharge, a chassis base 17 attached on a rear surface of panel 11, and driving boards 15 mounted in the rear of chassis base 17 and electrically connected to panel 11 to apply driving signals to panel 11.

A heat dissipation sheet 13 and a double coated tape (not shown) may be further interposed between the rear surface of panel 11 and the front surface of chassis base 17.

Heat dissipation sheet 13 conducts and disperses the heat generated from panel 11 in a plane direction. Heat dissipation sheet 13 may be made from a high thermal-conductive material such as an acryl-based material, a graphite-based material, a metal-based material, or a carbon nanotube-based material.

Since panel 11 and chassis base 17 are attached to each other by the double coated tape, heat dissipation sheet 13 may closely contact the rear surface of panel 11 and the front surface of chassis base 17.

Panel 11 is constructed with front and rear substrates 111 and 211. A space defined between front and rear substrates 111 and 211 is divided to form discharge cells. The discharge cells define respective sub-pixels each corresponding to a minimum unit for displaying an image. Address electrodes and display electrodes (e.g., paired sustain and scan electrodes that are not shown) cross each other along the discharge cells. The image is visually displayed by a gas discharge generated within the discharge cells.

Meanwhile, the address and display electrodes are electrically connected to the driving boards 15 to control the gas discharge of the discharge cells.

Each driving boards 15 is constructed with a board 63 and a circuit devices 61 installed on board 63. Driving boards 15 may be fixed on chassis base 17 by screws 19. Board 63 is mainly made from a printed circuit board (PCB) on which a circuit pattern is printed. In FIG. 1, for convenience, boards without circuit devices are illustrated for some of driving boards 15. It should be regarded, however, that circuit devices 61 are installed on the boards.

Circuit device 61 installed on board 63 selectively includes a heat dissipation plate 51. As circuit devices 61, a surface mounted device may be used for the integration of driving board 15.

Driving boards 15 include an image process/control board 115, an address driving board 215, a scan driving board 315, a sustain driving board 415, and a power board 515, which are functional blocks.

Image process/control board 115 generates a control signal required for driving the address and display electrodes by receiving an external image signal, and transmits the control signal to address driving board 215 and scan driving board 315 or power board 515.

Address driving board 215 generates an address pulse and applies the same to the address electrodes. Scan driving board 315 generates a scan or sustain pulse and applies the same to the scan electrode. Power board 515 supplies electrical power to drive the plasma display device.

A front cabinet (not shown) is installed in front of panel 11 and a back cover (not shown) is installed in the rear of chassis base 17. Therefore, an overall outer appearance of the plasma display device is defined by the front cabinet and the back cover.

Figure 2:
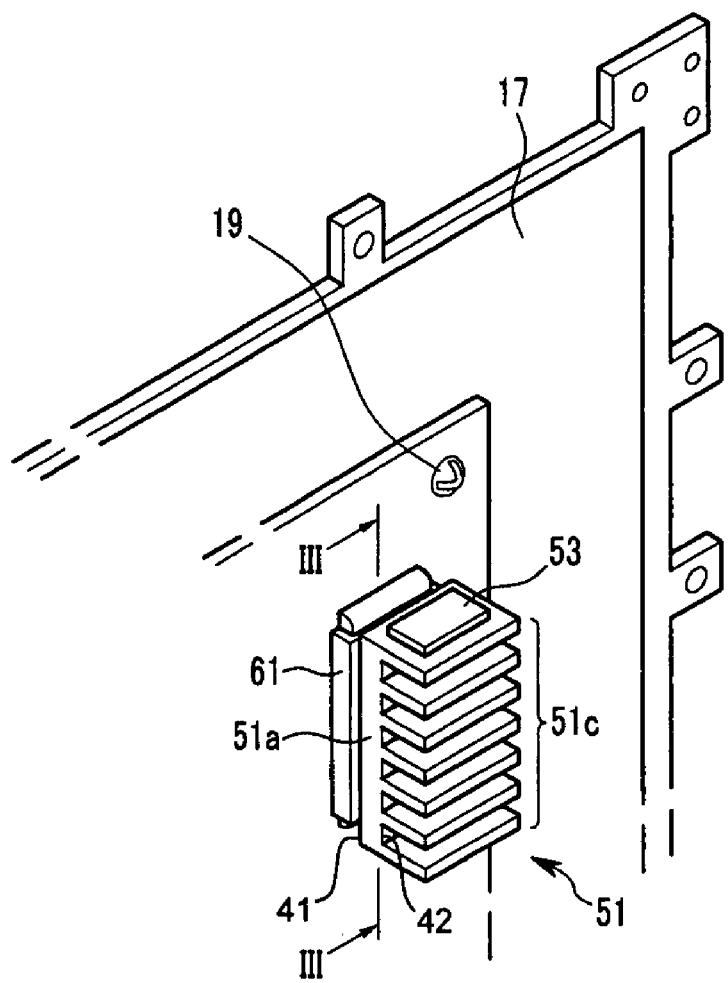
FIG. 2 is a perspective view of a heat dissipation plate installed on a circuit device according to the first embodiment of the principles of the present invention.

The following will describe the heat dissipation plate installed on the circuit device in detail with reference to FIG. 2. FIG. 2 is a schematic perspective view of the heat dissipation plate installed on the circuit device as a first embodiment of the principles of the present invention.

Heat dissipation plate 51 is constructed with a main body 51a and a plurality of heat dissipation fins 51c installed on main body 51a.

Main body 51a has a planar bottom surface 41 that can surface-contact circuit device 61. Heat dissipation fins 51c are installed on an opposite surface 42 to the planar bottom surface 41. As the contact area between heat dissipation plate 51 and circuit device 61 increases, the heat dissipation efficiency increases. Main body 51a may be formed to be larger than the circuit device.

Heat dissipation fins 51c extend from surface 42 of main body 51a in a normal direction to surface 42 of main body 51. By heat dissipation fins 51c, the contact area between heat dissipation plate 51 and the ambient air increases, thereby improving the heat dissipation efficiency of heat dissipation plate 51. At this point, heat dissipation fins 51c are spaced apart from each other by a certain distance.

According to the present embodiment, a weight member 53 is further installed on at least one of heat dissipation fins 51c. Weight member 53 increases the weight of the heat dissipation fin 51c on which weight member 53 is installed. Therefore, when heat dissipation fins 51c vibrate, the vibration frequency is varied with respect to different heat dissipation fin. That is, as the weight of heat dissipation fin 51c on which weight member 53 is installed increases, a vibration frequency is lowered. Heat dissipation fins 51c on which weight member 53 is not installed, however, have a relatively high vibration frequency. Therefore, the vibration frequencies between heat dissipation fins 51c are different from each other and thus interfere with each other. As a result, the overall vibration is reduced.

On the contrary, in the contemporary heat dissipation plate, since the weights of the dissipation fins are identical to each other and thus the vibration frequencies of the heat dissipation fins are the same, the vibration is undesirably boosted. Furthermore, since the vibration frequency of the heat dissipation fin is close to the proper vibration of the heat dissipation plate, the amplitude of the vibration increases and thus the vibration further increases.

Figure 3:
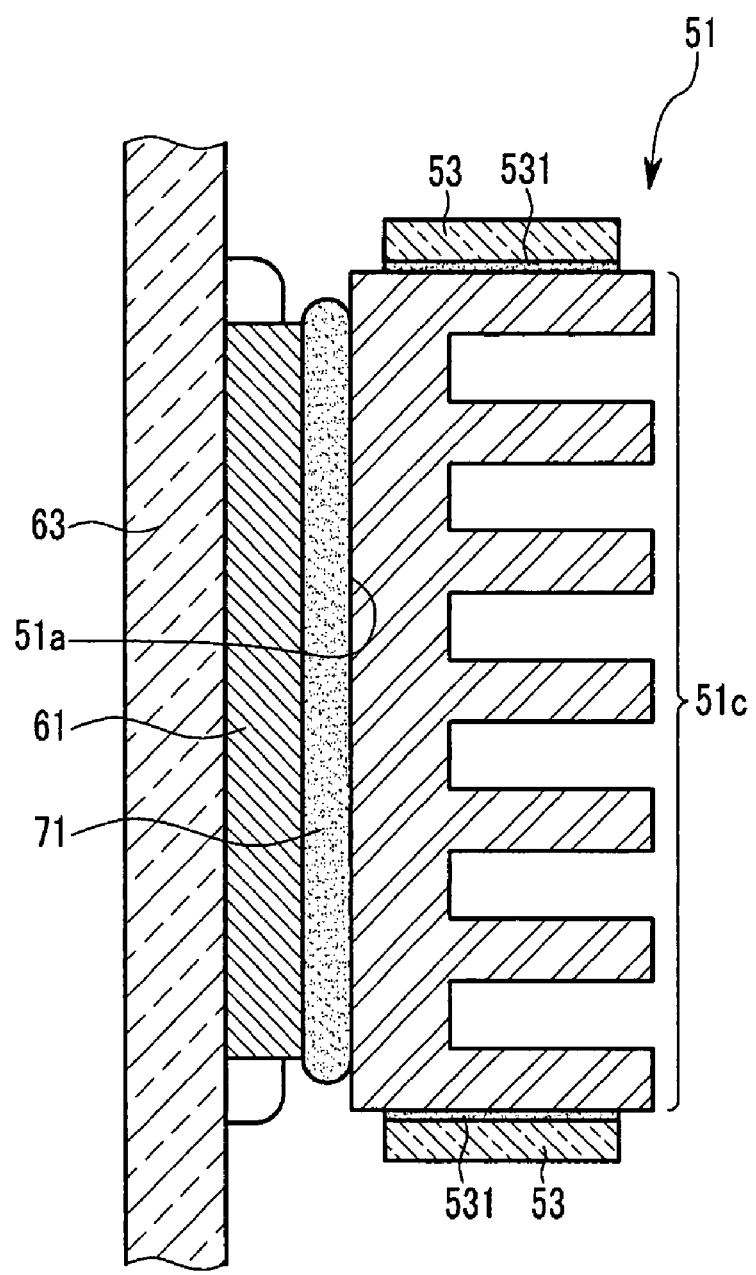
FIG. 3 is a sectional view taken along line III-III of FIG. 1.

FIG. 3 is a sectional view taken along line III-III of FIG. 2. As shown in FIG. 3, circuit device 61 is installed on board 63 and heat dissipation plate 51 is installed on circuit device 61 as a first embodiment of the principles of the present invention. In FIG. 3, an example where circuit device 61 is surface mounted is illustrated.

Main body 51a of heat dissipation plate 51 is coupled to circuit device 61 by a bonding member 71. Here, bonding member 71 may be made from a double coated tape, an adhesive agent, or silicon. Since the silicon is phase-changed from a solid state to a gel state, the working efficiency may be improved when the silicon is used as bonding member 71.

Heat dissipation fins 51c are formed to extend from main body 51a in a perpendicular direction with respect to main body 51a.

Weight members 53 are installed on the outermost heat dissipation fins 51c to increase the weights of the outermost heat dissipation fins 51c.

Weight members 53 may be installed on the corresponding heat dissipation fin 51c by a bonding member 531. Alternatively, weight members 53 may be integrally installed on the corresponding heat dissipation fin 51c by welding. Bonding member 531 may be a double coated tape, an adhesive agent, or silicon.

Weight member 53 may be made from a material that is heavy for its volume while having a relatively low elastic coefficient and low rigidity. For example, weight member 53 may be made from a high polymer such as soft rubber.

As described above, since weight member 53 is selectively formed on heat dissipation fin 51c, there is a weight difference between heat dissipation fins 51c on which weight member 53 is formed and heat dissipation fins 51c on which no weight member 53 is formed. That is, the outermost heat dissipation fins 51c on which the respective weight members 53 are installed are heavier than the rest of heat dissipation fins 51c on which no weight member is mounted.

As a result, the vibration frequencies generated by the vibrations of heat dissipation fins 51c during the operation of circuit device 61 become different from each other. That is, the vibration frequencies of the outermost heat dissipation fins 51c are lowered due to weight members 53. Therefore, the lowered vibration frequencies interfere with the vibration frequencies of the rest of heat dissipation fins 51c on which weight members 51 are not installed, thereby reducing the noise generated by heat dissipation plate 51.

Figure 6:
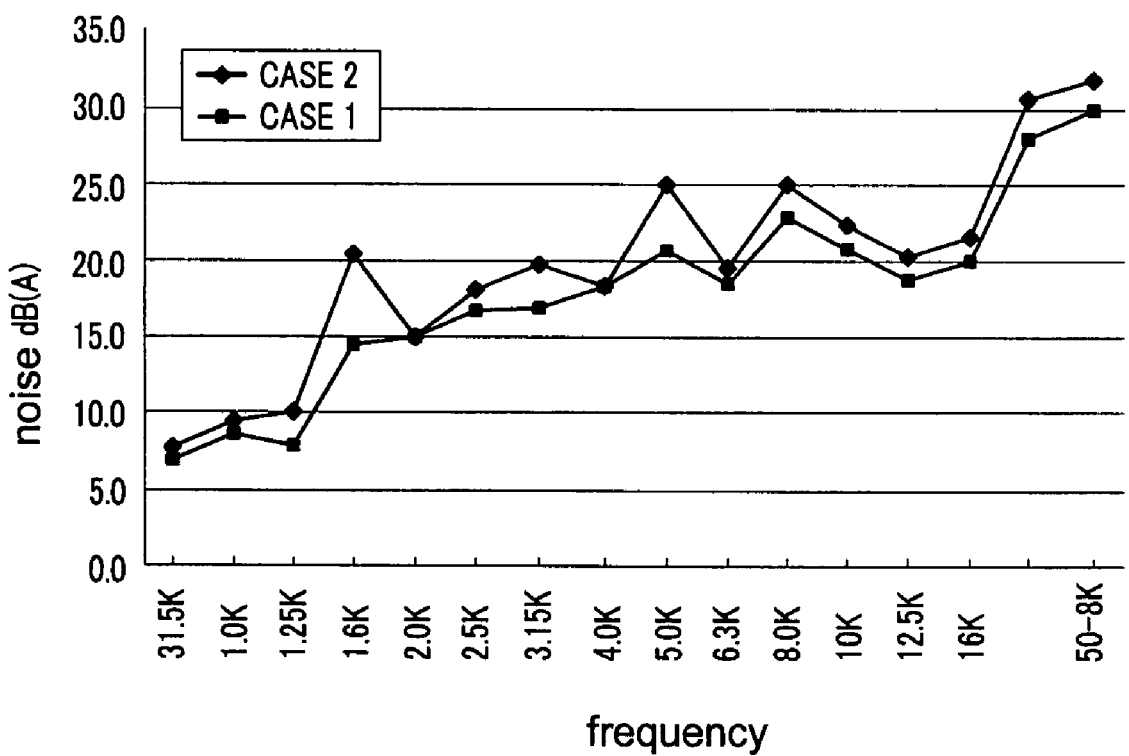
FIG. 6 is a graph illustrating a comparison result between noises measured at a heat dissipation plate on which weight members are installed and a heat dissipation plate on which no weight member is installed.

FIG. 6 is a graph illustrating a comparison result between noises measured at a heat dissipation plate on which weight members are installed (case 1 in FIG. 6) and a heat dissipation plate on which no weight member is installed (case 2 in FIG. 6). As shown in the graph of FIG. 6, it can be noted that the noise of the heat dissipation plate of this embodiment is lowered at frequencies of a 1.6K-band and a 5.0K-band.

Figure 4:
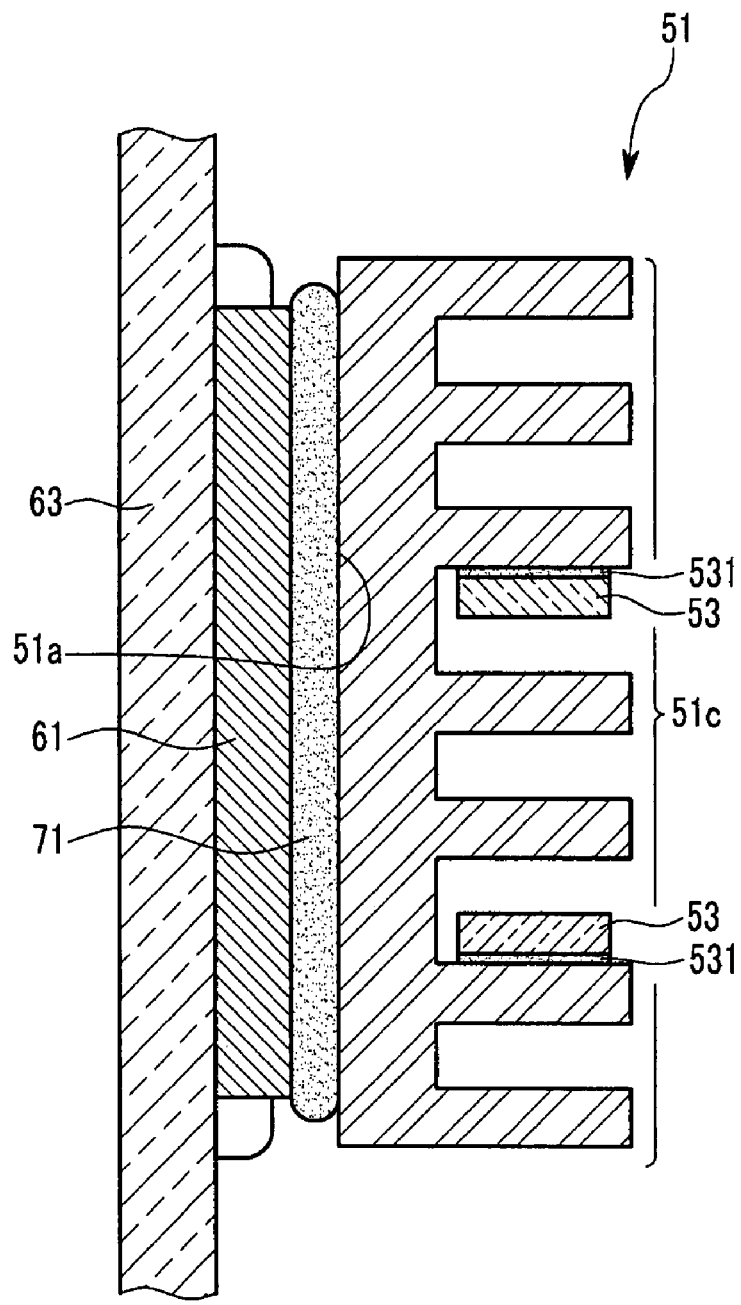
FIG. 4 is a sectional view illustrating an example where weight members are non-uniformly installed on heat discharge fins according to a second embodiment of the principles of the present invention.

FIG. 4 shows an embodiment where weight members 53 are randomly installed on heat dissipation fins 51c. In the embodiment of FIG. 3, weight members 53 are installed on the respective outermost heat dissipation fins 51c so that heat dissipation plate 51 is symmetrically formed. In the embodiment of FIG. 4, however, weight members 53 are randomly installed on some of heat dissipation fins 51c in no particular order.

In the above embodiments of FIGS. 3 and 4, an example where some of heat dissipation fins 51c become different in weight from the rest of heat dissipation fins 51c by installing weight members 53 thereon is illustrated. Alternatively, it is also possible to make some of heat dissipation fins 51c different in weight from the rest of heat dissipation fins 51c by increasing the weights thereof while identically maintaining the shapes of heat dissipation fins 51c. Still alternatively, as shown in FIG. 5, heat dissipation fins 81c may be different in weight from the rest of heat dissipation fins 81c by changing the shape thereof.

Figure 5:
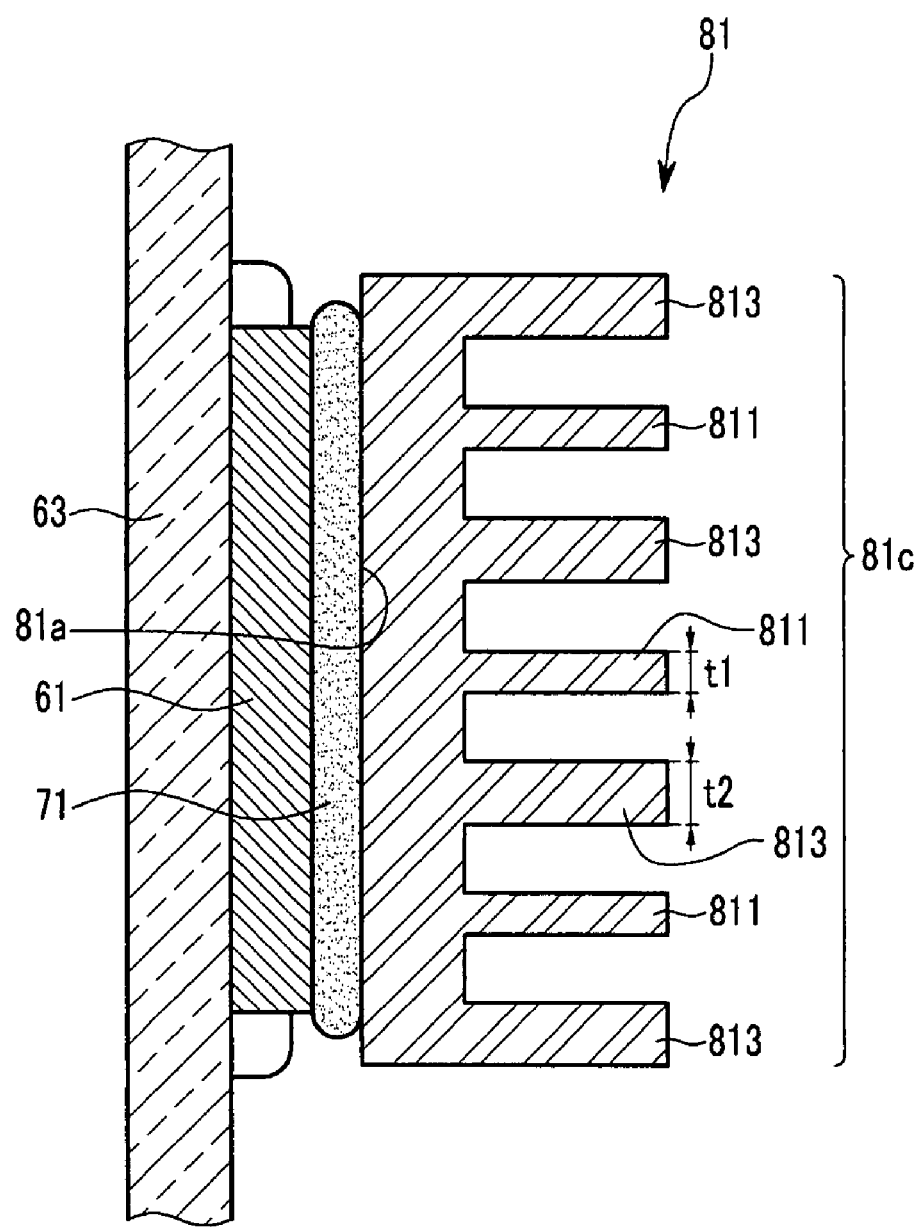
FIG. 5 is a sectional view illustrating an example where thicknesses of heat dissipation fins are different from each other according to a third embodiment of the principles of the present invention.

FIG. 5 shows an example where some of the heat dissipation fins are different in weight from the rest of the heat dissipation fins by varying the thickness of the heat dissipation fin.

Referring to FIG. 5, a heat dissipation plate 81 installed on a circuit device 61 is constructed with a main body 81a and heat dissipation fins 81c. Heat dissipation fins 81c include a plurality of first heat dissipation fins 811 and a plurality of second heat dissipation fins 813. Main body 81a is coupled to circuit device 61 by a bonding member 71.

Heat dissipation fins 81c extend normally from main body 81a. At this point, some of heat dissipation fins 81c may be different in weight from the rest of heat dissipation fins 81c.

That is, each of first heat dissipation fins 811 has a fist thickness t1 while each of second heat dissipation fins 813 has a second thickness t2 greater than first thickness t1. Second heat dissipation fins 813 that are thicker than first heat dissipation fins 811 are disposed between first heat dissipation fins 811.

Since second heat dissipation fins 813 are thicker than first heat dissipation fins 811, second heat dissipation fins 813 are heavier than first heat dissipation fins 811. Therefore, when heat dissipation plate 81 vibrates, the vibration frequencies of second heat dissipation fins 813 are lower than those of first heat dissipation fins 811.

As a result, when heat dissipation plate 81 vibrates, the vibration frequencies of second heat dissipation plates 813 interfere with those of first heat dissipation plates 811, thereby reducing the noise generated by heat dissipation plate 81.

According to the above-described present embodiment, since the vibration frequencies of some of the heat dissipation fins are different from those of the rest of the heat dissipation fins due to a weight difference between them, the vibration frequencies of the heat dissipation fins interfere with each other, thereby reducing the noise caused by the vibration of the heat dissipation plate.

Although exemplary embodiments of the present invention have been described in detail hereinabove, it should be clearly understood that many variations and/or modifications of the basic inventive concept taught herein still fall within the spirit and scope of the present invention, as defined by the appended claims.

What is claimed is:

1. A plasma display device, comprising:
   a plasma display panel for displaying an image by using a gas discharge;
   a chassis base coupled to the plasma display panel to support the plasma display panel;
   a driving board comprising a board and a circuit device, and applying a driving signal to the plasma display panel;
   a heat dissipation plate having a plurality of heat dissipation fins and being installed on the circuit device to dissipate heat generated from the circuit device; and
   a weight member installed on the heat dissipation fins and increasing a weight of the heat dissipation fins on which the weight member is installed.

2. The plasma display device of claim 1, with the weight member being coupled to the heat dissipation fin by a bonding member.

3. The plasma display device of claim 1, with the weight member being coupled to the heat dissipation fin by welding.

4. The plasma display device of claim 1, with the weight member being formed on each of the outermost heat dissipation fins among the heat dissipation fins.

5. The plasma display device of claim 1, with the weight member being made from a high polymer.

6. The plasma display device claim 1, with the weight member being randomly formed on at least one of the heat dissipation fins.

7. The plasma display device of claim 1, with the heat dissipation plate being constructed with a main body, which is attached to the circuit device and from which the heat dissipation fins extend, and with the adjacent heat dissipation fins facing each other.

8. A plasma display device, comprising:
   a plasma display panel for displaying an image using a gas discharge;
   a chassis base coupled to the plasma display panel to support the plasma display panel;
   a driving board comprising aboard and a circuit device, and applying a driving signal to the plasma display panel; and
   a heat dissipation plate comprising heat dissipation fins and installed on the circuit device to dissipate heat generated from the circuit device, with some of the heat dissipation fins being different in shape and different in weight from the rest of the heat dissipation fins.

9. The plasma display device of claim 8, with the heat dissipation fins comprising a first heat dissipation fin having a first thickness and a second heat dissipation fin having a second thickness greater than the first thickness.

10. The plasma display device of claim 8, with the heat dissipation plate being constructed with a main body, which is attached to the circuit device and from which the heat dissipation fins extend, and with the adjacent dissipation fins facing each other.

11. A plasma display device, comprising:
a plasma display panel for displaying an image using a gas discharge;
a chassis base coupled to the plasma display panel to support the plasma display panel,
a driving board comprising a board and a circuit device and applying a driving signal to the plasma display panel; and
a heat dissipation plate having heat dissipation fins and installed on the circuit device to dissipate heat generated from the circuit device, with some of the heat dissipation fins being different in weight from the rest of the heat dissipation fins.

* * * * *